(12) United States Patent
Deng et al.

(10) Patent No.: US 8,075,330 B1
(45) Date of Patent: Dec. 13, 2011

(54) MOUNTING APPARATUS FOR MEMORY CARD

(75) Inventors: Ping-Chuan Deng, Shenzhen (CN); Zheng-Heng Sun, Tu-Cheng (TW)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/071,483

(22) Filed: Mar. 24, 2011

(30) Foreign Application Priority Data

Jan. 28, 2011 (CN) .......................... 2011 1 0031154

(51) Int. Cl.
*H01R 13/62* (2006.01)
(52) U.S. Cl. ...................................................... 439/328
(58) Field of Classification Search .................. 439/328, 439/325–327, 372, 157, 168, 160
See application file for complete search history.

(56) References Cited

U.S. PATENT DOCUMENTS

| | | | | |
|---|---|---|---|---|
| 4,872,853 A * | 10/1989 | Webster | ........................ | 439/327 |
| 4,898,540 A * | 2/1990 | Saito | ............................. | 439/153 |
| 5,417,580 A * | 5/1995 | Tsai | ................................ | 439/328 |
| 5,577,922 A * | 11/1996 | Enomoto et al. | .............. | 439/157 |
| 5,584,705 A * | 12/1996 | Lin | ................................. | 439/157 |
| 5,634,803 A * | 6/1997 | Cheng et al. | ................... | 439/157 |
| 6,045,385 A * | 4/2000 | Kane | ............................. | 439/327 |
| 6,083,026 A * | 7/2000 | Trout et al. | ..................... | 439/328 |
| 6,168,452 B1 * | 1/2001 | Lai et al. | ........................ | 439/342 |
| 6,431,898 B1 * | 8/2002 | Asakawa | ....................... | 439/325 |
| 6,599,142 B2 * | 7/2003 | Bu | ................................. | 439/157 |
| 6,702,598 B1 * | 3/2004 | Lo | ................................. | 439/157 |
| 7,252,523 B1 * | 8/2007 | Pennypacker et al. | ......... | 439/160 |
| 7,438,569 B2 * | 10/2008 | Pennypacker et al. | ........ | 439/157 |
| 7,661,974 B1 * | 2/2010 | Sun | ................................. | 439/328 |
| 7,677,907 B2 * | 3/2010 | Guan et al. | ..................... | 439/157 |
| 7,857,628 B2 * | 12/2010 | Chung et al. | ..................... | 439/59 |

* cited by examiner

*Primary Examiner* — Tulsidas C Patel
*Assistant Examiner* — Harshad Patel
(74) *Attorney, Agent, or Firm* — Altis Law Group, Inc.

(57) ABSTRACT

A mounting apparatus for mounting a memory card includes a socket, a locking member attached to one end of the socket, and an operation member movably attached to the locking member. The operation member is used for operating the locking member to lock or release the memory card.

6 Claims, 6 Drawing Sheets

MOUNTING APPARATUS FOR MEMORY CARD

BACKGROUND

1. Technical Field

The present disclosure relates to mounting apparatuses and, more particularly, to a mounting apparatus for a memory card.

2. Description of Related Art

Referring to FIG. 6, a memory card is installed in a socket 100 of a motherboard. Two latch members 200 are attached to two opposite ends of the socket 100. Each latch member 200 includes a latch portion 201 for latching the memory card, and a handle 202 integrally extending outward from the latch portion 201 for operating the latch portion 201. The handle 202 may interfere with other elements on the motherboard when the other elements are arranged near the memory card, which means full use cannot be made of space around socket 100.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings in which like references indicate similar elements, is illustrated by way of examples and not by way of limitation. It should be noted that references to "an" or "one" embodiment in this disclosure are not necessarily to the same embodiment, and such references mean at least one.

Figure 1:
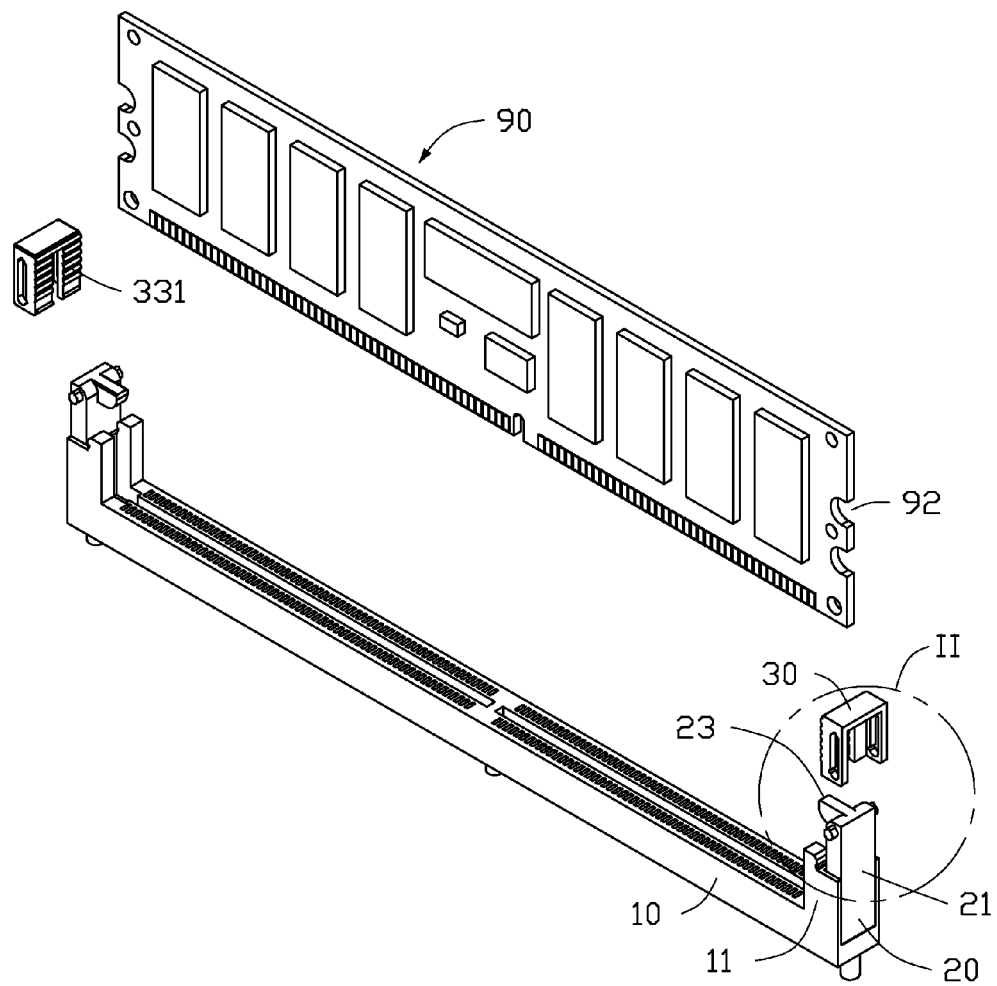
FIG. 1 is an exploded, isometric view of an embodiment of a mounting apparatus, together with a memory card.

Referring to FIG. 1, an embodiment of a mounting apparatus is provided to mount a memory card 90. The mounting apparatus includes a socket 10 mounted on a motherboard (not shown in pictures), two locking members 20, and two operation members 30. Two cutouts 92 are defined in opposite ends of the memory card 90, respectively. A connecting portion 11 is formed on each end of the socket 10.

Figure 2:
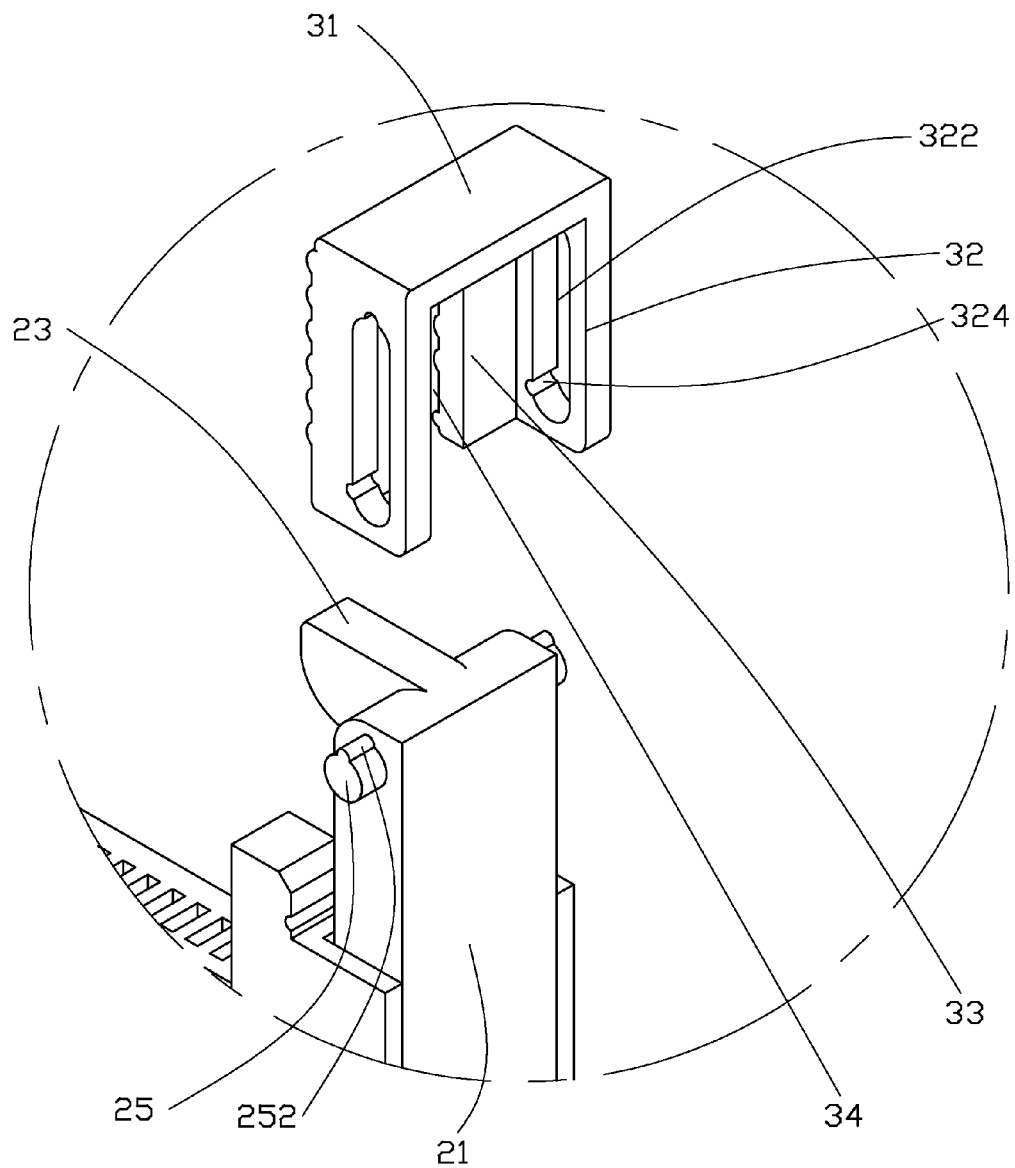
FIG. 2 is an enlarged view of the circled portion II of FIG. 1.

Referring to FIG. 2, each locking member 20 is substantially L-shaped, and includes a mounting portion 21 fixed to the corresponding connecting portion 11, and a locking portion 23 substantially perpendicularly extending from a top of the mounting portion 21 toward the other locking member 20. Two shafts 25 extend from opposite side surfaces of the top of the locking portion 23, respectively. A positioning block 252 extends up from a circumference of each shaft 25.

Each operation member 30 includes a main body 31, two parallel joining portions 32 respectively extending down from opposite ends of the main body 31, and a side plate 33 extending down from a side of the main body 31. A slit 34 is defined in a middle portion of the side plate 33. A plurality of skidproof pieces 331 are formed on the side plate 33, opposite to the joining portions 32. Each joining portion 32 defines a vertical slot 322. A cutout 324 is defined in a side surface bounding a lower portion of the slot 322, and communicating with the slot 322.

Figure 3:
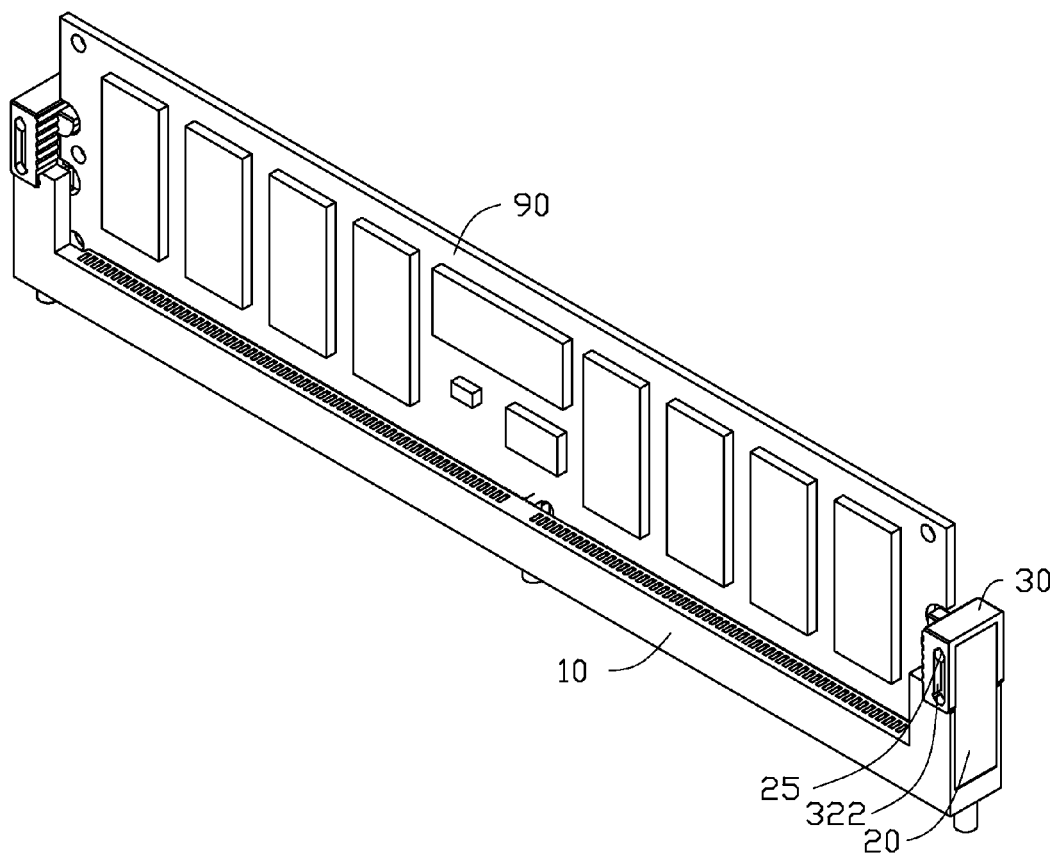
FIG. 3 to FIG. 5 are assembled, isometric views of FIG. 1, showing different use states.
Figure 4:
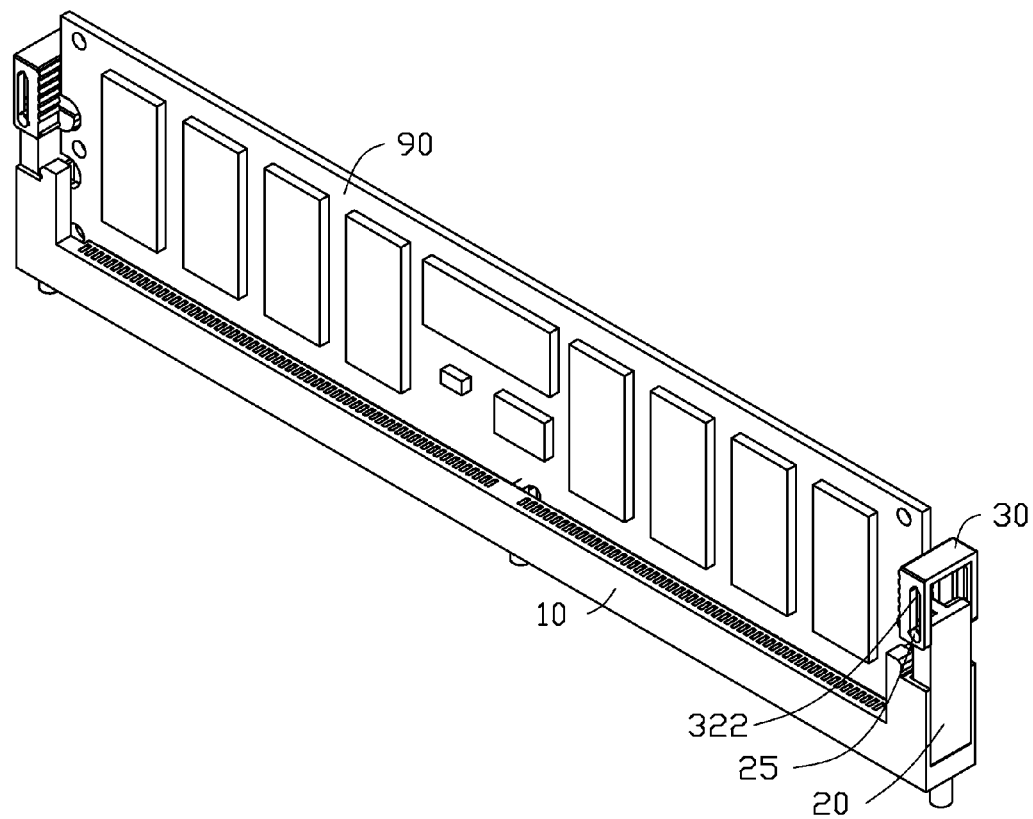
Figure 5:
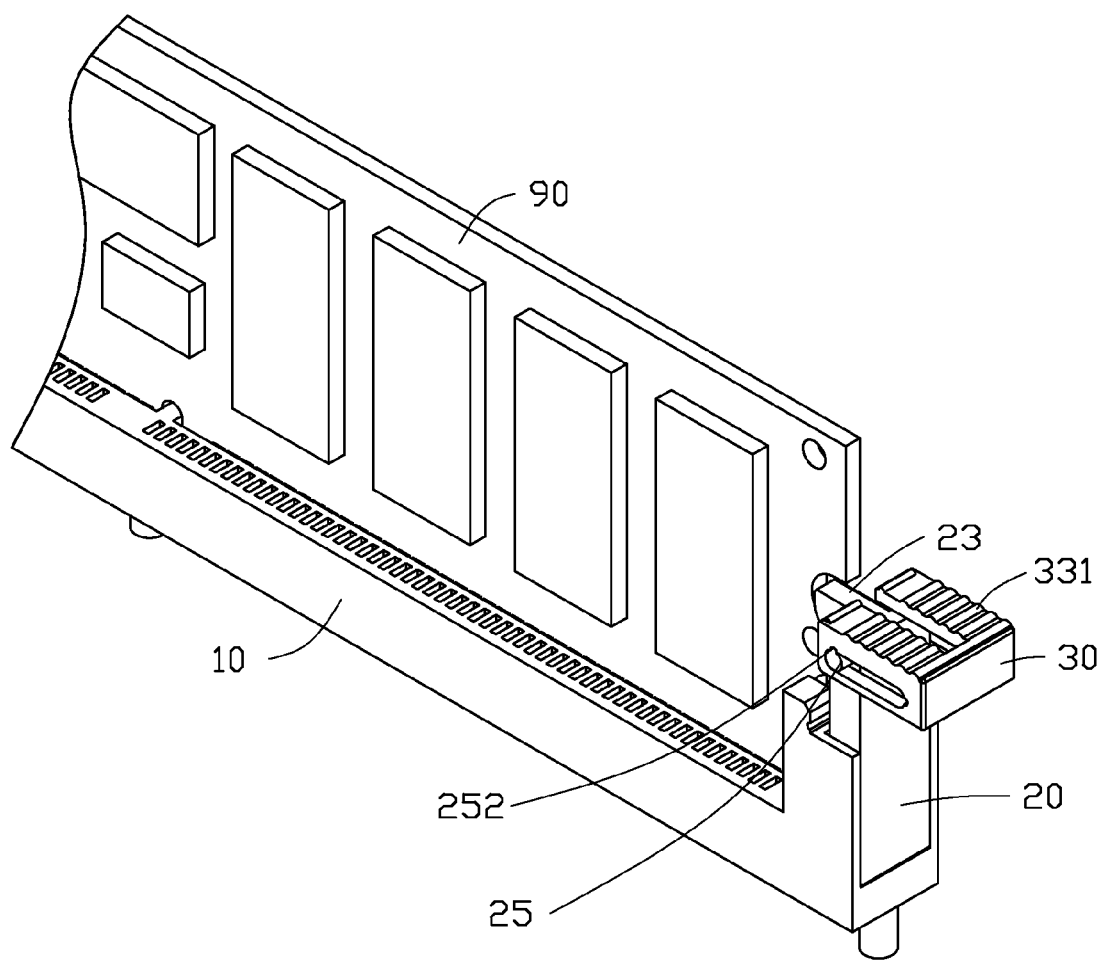
Figure 6:
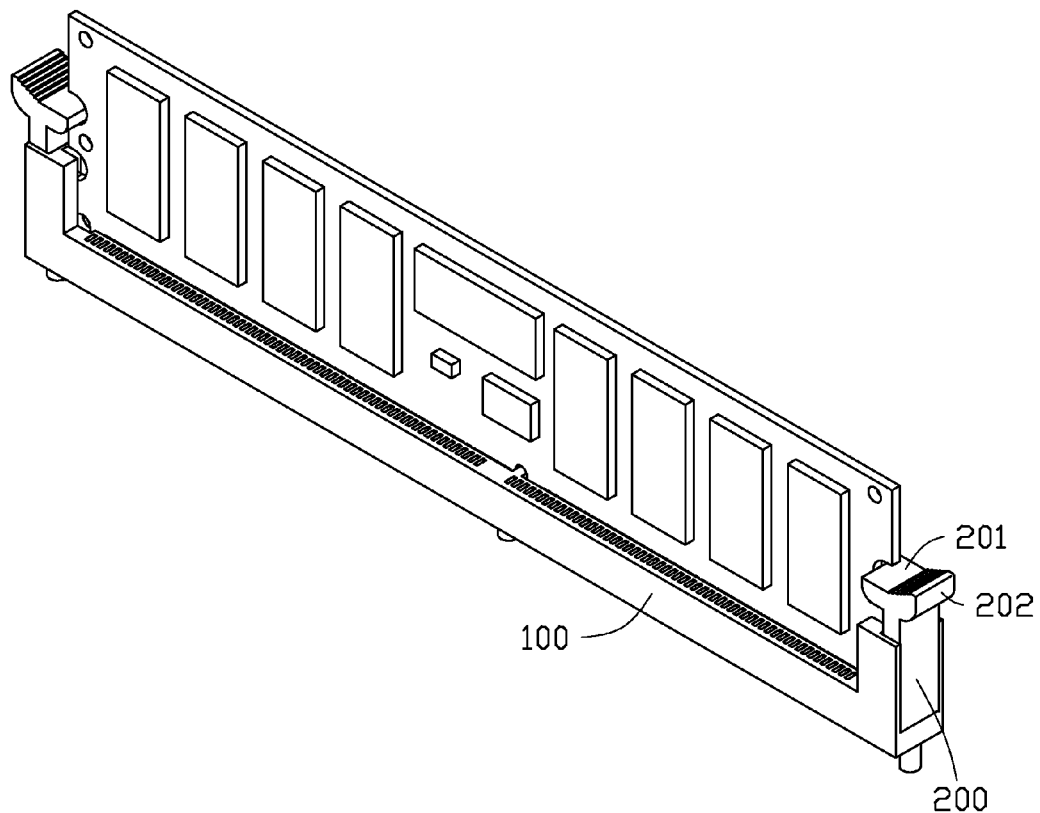
FIG. 6 is an exploded, isometric view of a related-art mounting apparatus, together with a memory card.

Referring to FIGS. 3 to 5, in assembly, the mounting portions 21 are fixed in the connecting portion 11. The operation members 30 are attached to the corresponding locking member 20. The shafts 25 of the locking members 20 are slidably and pivotably engaged in the slots 322 of the operation members 30, thus the operation members 30 are movably attached to the corresponding locking member 20. The locking portions 23 of the locking members 20 extend through the slits 34 of the corresponding operation members 30.

In use, the operation members 30 are moved upward and then pivoted outward around the corresponding shafts 25 respectively, until the positioning blocks 252 of the shafts 25 are engaged in the cutouts 324 to limit movement of the operation members 30 relative to the locking members 20 so that when the operation members 30 are further pushed outward, the mounting portions 21 will deform outward. The memory card 90 is plugged into the socket 10. The operation members 30 are released, and the mounting portions 21 are restored, to make the locking portions 23 engage in the corresponding cutouts 92 of the memory card 90. The operation members 30 are pivoted inward and then slide down, until the main bodies 31 of the operation members 30 cover the tops of the corresponding mounting portions 21, which saves space on the motherboard.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A mounting apparatus for mounting a memory card, the mounting apparatus comprising:
    a socket;
    a locking member mounted to one end of the socket, wherein the locking member comprises a mounting portion and a locking portion, a connecting portion is formed from the end of the socket, the mounting portion is fixed to the connecting portion, and two shafts extend from opposite side surfaces of the mounting portion; and
    an operation member movably attached to the locking member, wherein the operation member comprises a main body and two parallel joining portions extending from opposite ends of the main body, each of the joining portions defines a slot for slidably and pivotably receiving the corresponding shaft, and the operation member is operable to operate the locking member to lock or release the memory card;
    wherein a cutout is defined in an inner surface of each of the slots, a positioning block extends from a circumference of each of the shafts, and the positioning block is engagable in the cutout to limit the operation member to further pivot outward relative to the locking member.

2. The mounting apparatus of claim 1, wherein the operation member further comprises a side plate extending down from a side of the main body, and a slit is defined in a middle portion of the side plate for slidably receiving the locking portion of the locking member.

3. The mounting apparatus of claim 2, wherein a plurality of skidproof pieces are formed on the side plate, opposite to the joining portions.

4. A mounting apparatus for mounting a memory card, the mounting apparatus comprising:
- a socket;
- two locking members mounted to opposite ends of the socket, wherein each of the locking members comprises a mounting portion and a locking portion, a connecting portion is formed from each of the ends of the socket, the mounting portion is fixed to the corresponding connecting portion, and two shafts extend from opposite side surfaces of each of the mounting portions; and
- two operation members movably attached to the corresponding locking members, wherein each of the operation members comprises a main body and two parallel joining portions extending from opposite ends of the main body, each of the joining portions defines a slot for slidably and pivotably receiving the corresponding shaft, the operation members are operable to operate the locking members to lock or release the memory card;
- wherein a cutout is defined in an inner surface of each of the slots, a positioning block extends from a circumference of each of the shafts, the positioning block is engagable in the cutout to limit the operation member to further pivot outward relative to the locking member.

5. The mounting apparatus of claim 4, wherein each of the operation members further comprises a side plate extending down from a side of the main body, and a slit is defined in a middle portion of the side plate for slidably receiving the locking portion of the corresponding locking member.

6. The mounting apparatus of claim 5, wherein a plurality of skidproof pieces are formed on the side plate, opposite to the joining portions.

* * * * *